United States Patent
Takayama et al.

(10) Patent No.: US 6,329,676 B1
(45) Date of Patent: Dec. 11, 2001

(54) FLAT PANEL SOLID STATE LIGHT SOURCE

(76) Inventors: Toru Takayama, 2275 Sharon Rd. No. 216, Menlo Park, CA (US) 94025; Takaaki Baba, 535 Arboleda Dr., Los Altos, CA (US) 94024

( * ) Notice: Subject to any disclaimer, the term of this patent is extended or adjusted under 35 U.S.C. 154(b) by 0 days.

(21) Appl. No.: 09/259,607

(22) Filed: Mar. 1, 1999

(51) Int. Cl.$^7$ ..................................................... H01L 33/00
(52) U.S. Cl. .................................. 257/95; 257/98; 257/88
(58) Field of Search .................................. 257/95, 98, 88

(56) References Cited

U.S. PATENT DOCUMENTS

| | | |
|---|---|---|
| 3,763,405 | 10/1973 | Mitsuhata . |
| 4,700,206 | 10/1987 | Yamakawa . |
| 4,788,161 * | 11/1988 | Goto et al. . |
| 5,357,123 * | 10/1994 | Sugawara . |
| 5,359,260 * | 10/1994 | Rawlings et al. . |
| 5,362,673 | 11/1994 | Iechi . |
| 5,381,023 | 1/1995 | Komatsu . |
| 5,386,139 * | 1/1995 | Idei et al. . |
| 5,597,740 | 1/1997 | Ito et al. . |
| 5,606,181 * | 2/1997 | Sakuma et al. . |
| 5,714,772 | 2/1998 | Fang et al. . |
| 5,813,753 * | 9/1998 | Vriens et al. . |

FOREIGN PATENT DOCUMENTS

| | | |
|---|---|---|
| 1328303 | 8/1973 | (GB) . |
| WO 97/48138 | 12/1997 | (WO) . |
| WO 00/38250 | 6/2000 | (WO) . |

* cited by examiner

*Primary Examiner*—Stephen D. Meier

(57) ABSTRACT

A light emitting diode structure capable of use within a flat panel device with small thickness and large area size. In some embodiments, the LED structure is combined with phosphors to generate light of varying chrominance and luminance including white and other visible spectrum light, and may be used to provide either ambient or accent illumination. The flat panel light source comprises a first GaN cladding layer of a first conductance type, a second GaN cladding layer of a second conductance type formed on the first layer and having at least one window region formed on the first cladding layer, an $In_xGa_{1-x}N$ active layer and a third cladding layer of an opposite conduction type formed on the second cladding layer. One or more phosphor layers for converting light of a first wavelength to light of a second wavelength may be added to provide polychromatic emissions.

10 Claims, 20 Drawing Sheets

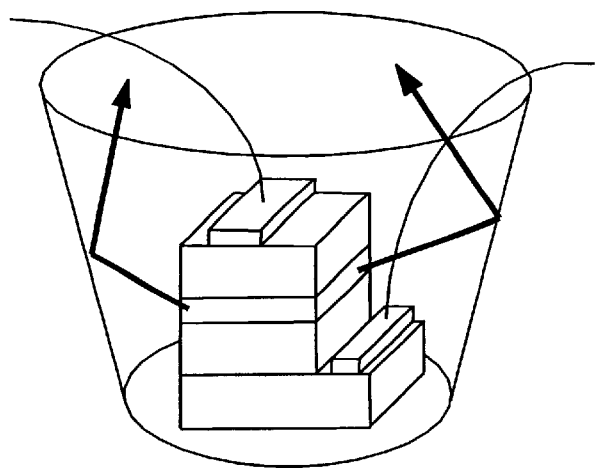
FIGURE 1
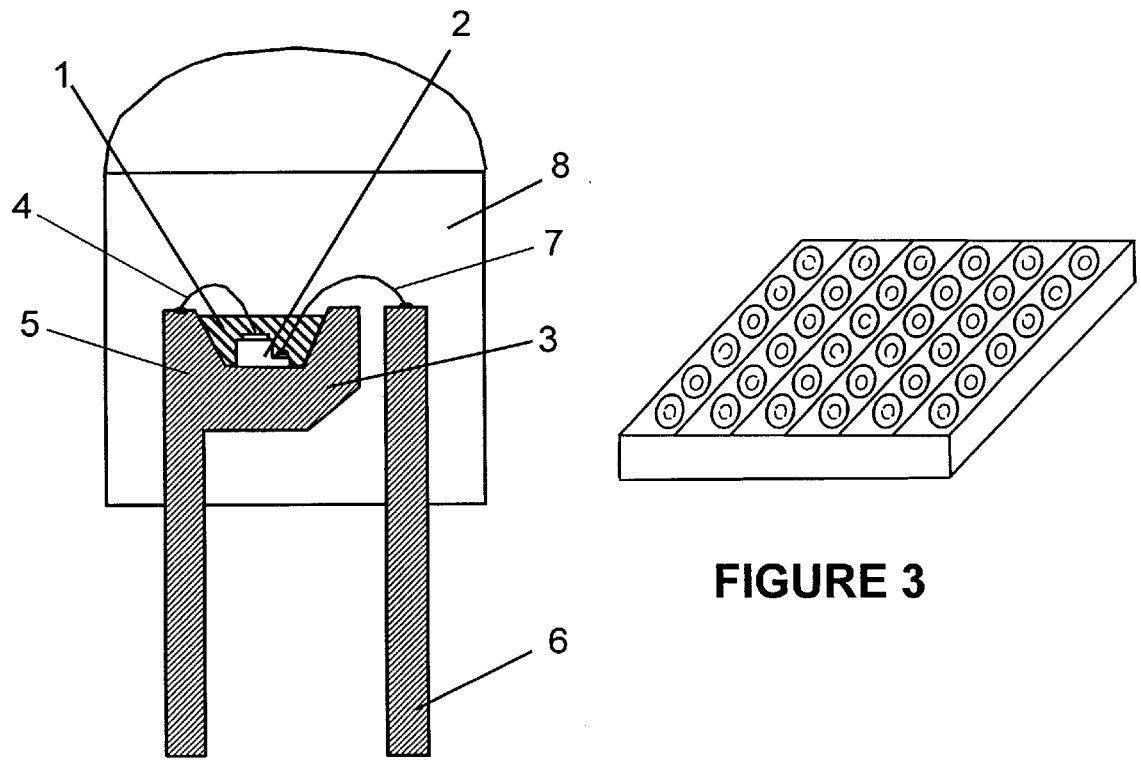
FIGURE 2
FIGURE 3

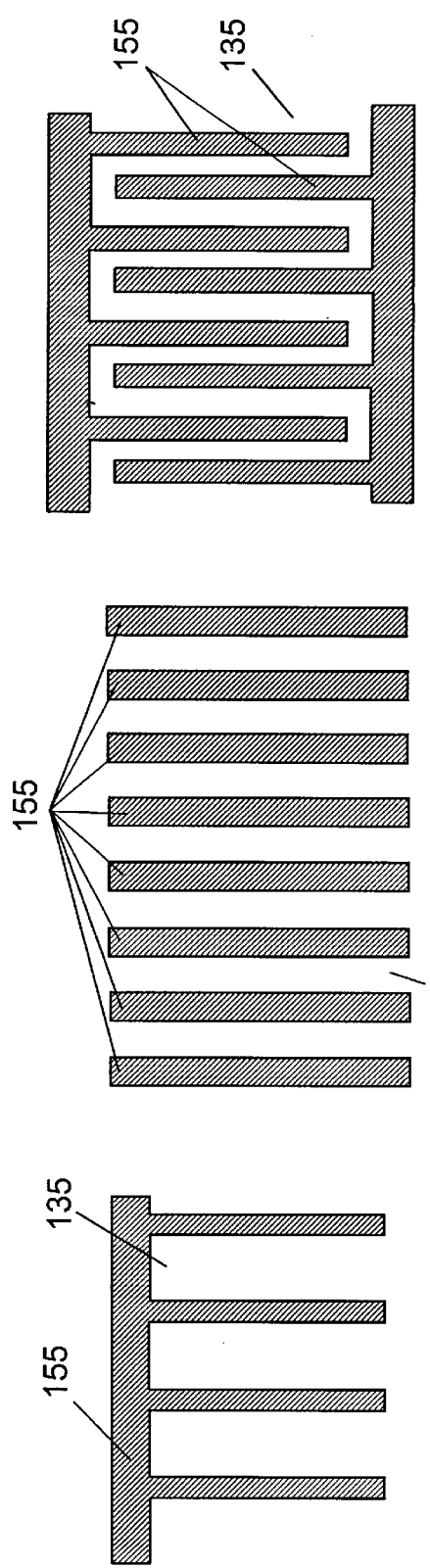
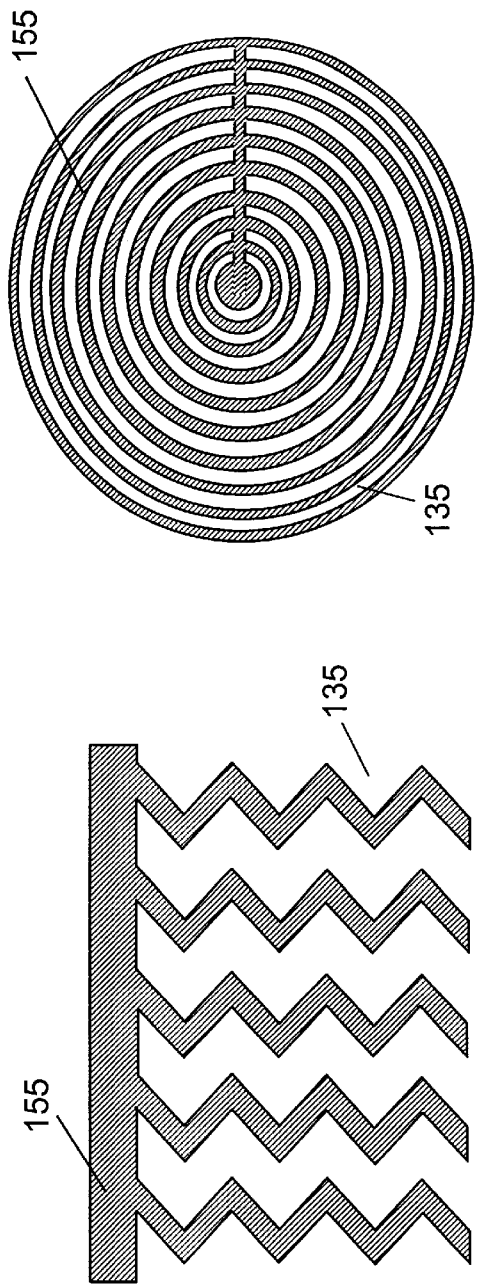
FIGURE 16A
FIGURE 16B
FIGURE 16C
FIGURE 16D
FIGURE 16E

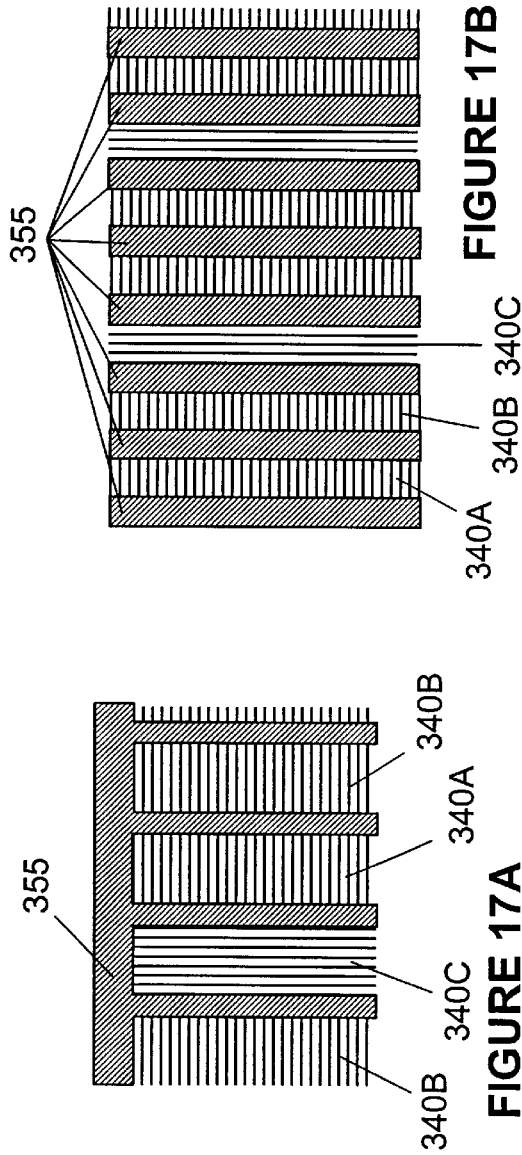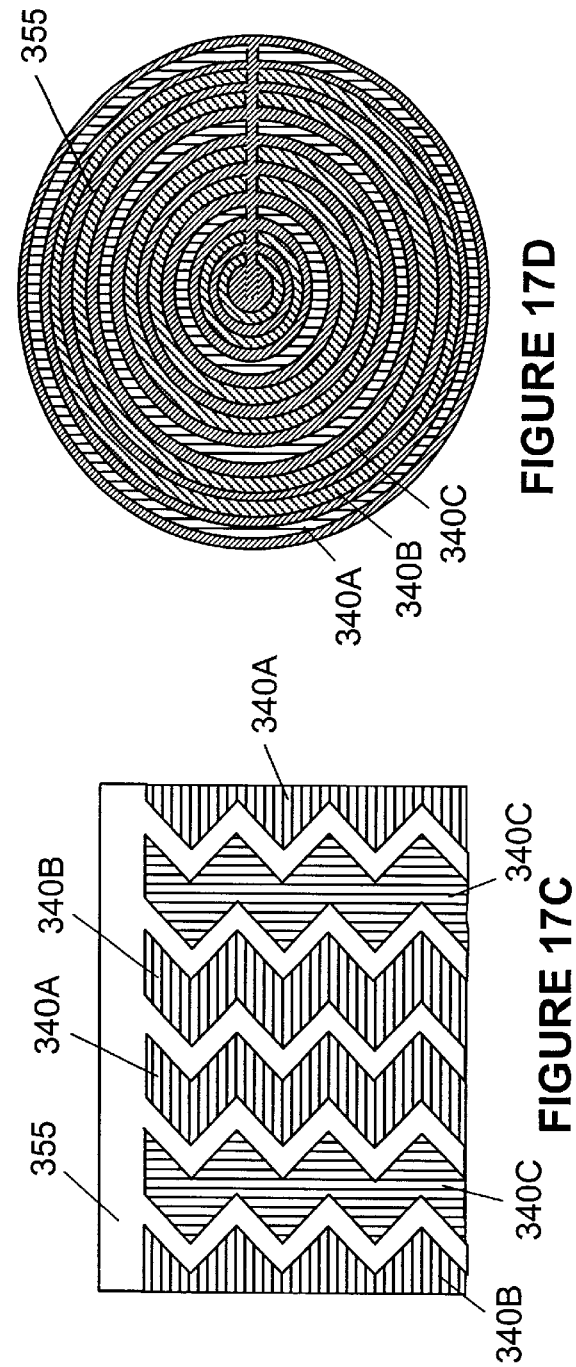

FLAT PANEL SOLID STATE LIGHT SOURCE

FIELD OF THE INVENTION

The present invention relates to a flat panel light emitting devices, and more particularly relates to flat panel light emitting devices having substantially uniform light emission and capable of varying both luminance and chrominance.

BACKGROUND OF THE INVENTION

Visible light sources—and usually white or near-white light sources—are demanded for illumination throughout the world. Fluorescent, incandescent, and other lamps and bulb have become ubiquitous for illumination. In addition, light-emitting diodes, or LEDS, have become very common for single or limited wavelength forms of illumination such as laser pointers, indicator lamps and so on.

Recently, considerable attention has been given to the potential for using LEDs as a white light source because the power consumption of LEDs is, generally, lower than that of fluorescent lamps or bulb lamps. However, it has been difficult to use such LEDs as sources for white light due to the unavailability highly efficient blue LEDs, Recent progress in group III-nitride semiconductor systems has enabled the development of the InGaN/GaN DH (Double Heterojunction) structure, which does permit the high quantum efficiency emission of blue light. As a result, blue LEDs are now commercially available.

Obtaining white light from blue LEDs has been problematic. One effective approach to obtain white light is to mix blue and yellow light. Referring first to FIGS. 1 and 2, there is first shown in schematic form the emission of white light using a prior art blue LED combined with a yellow phosphor (S. Nakamura, SPIE, Vol. 3002, pp26–35, 1997.) In the prior art arrangement shown in FIG. 2, YAG (yttrium aluminum garnet) phosphor 1 is formed on the top of a blue LED 2 having an InGaN/GaN DH structure. In this structure, current is injected from the lead frame 3 with a reflector cup 4 to the LED chip 2 through a conductor 5. Then the current flows from the LED chip 2 to the lead frame 6. The LED chip 2 is activated by the injected current and emits blue light. The YAG phosphor 1 is excited by the blue light from the LED chip 2 and emits yellow fluorescence. The mixture of the blue emission from the LED chip 2 and the yellow emission from the phosphor 1 results in a white emission. In order to improve the external emission efficiency of the white light, an epoxy lens 7 is used. Thus white light is obtained by this structure.

However, to obtain a white light source panel having a large area size, it is necessary to use large number of LEDs. For the prior art design shown in FIGS. 1 and 2, the driving circuit becomes complicated and the fabrication cost becomes high. Moreover, as shown in FIG. 3, the luminescence pattern of the panel becomes dot-like when a large number of conventional LEDs are gathered into a single panel. This results from the "point source" nature of conventional LED's. Therefore, it is difficult to use a large number of prior art LEDs to provide a white light panel having uniformly distributed emission power. Further, while a thin lighting panel is preferred, in the art shown in FIGS. 1–3 the thickness of the panel becomes large because the thickness of the panel must be larger than the height of the LEDs. These problems must be solved to obtain a thin white light source panel having a large area with uniform white light emission.

SUMMARY OF THE INVENTION

The present invention overcomes many of the limitations of the prior art by providing a new and novel LED structure which permits the fabrication of a thin, large area flat panel polychromatic light source having substantially uniform emission power distribution. Various alternative embodiments will be described, including some in which the LED structure of the invention may be combined with phosphors to generate polychromatic light. While some aspects of the invention are intended to provide polychromatic light emissions, the emission of white light will hereinafter generally be used as exemplary of the polychromatic emissions achievable with the present invention.

In general, the LED structure of the present invention involves a pn-junction LED fabricated from a plurality of cladding layers and an active layer deposited above either a conductive or insulating substrate. Each pn-junction LED is formed as a ridge or strip which essentially extends outward in a direction substantially orthogonal to the substrate. A plurality of such ridges are fabricated in parallel on a single substrate, with phosphor deposited in the intermediate channels formed between the ridges. With proper placement of a pair of electrodes, the LED emits light continuously along the entire ridge/channel boundary, rather than in the point source arrangement of the prior art.

In some embodiments, the light may be generated as a combination of a blue LED and a yellow phosphor. In such embodiments, the LED array typically comprises a plurality of ridges where InGaN material is used for the active layer, together with a YAG phosphor deposited in the intermediate channels between the InGaN material. In other embodiments, the polychromatic light may be generated by means of a pluraltiy of ultraviolet LEDs such as those resulting from AlGaN, formed into ridges, together with appropriate phosphors that emit red, green and blue light, respectively, formed alternately in the intermediate channels between the LED ridges. The proportion of red, green and blue components may be varied to permit polychromatic emissions. In addition, by selective driving of the electrodes, certain of the LED ridges may be turned on or off to permit dimming of the panel as a whole or polychromatic variation. As will be appreciated from the foregoing, typically although not necessarily, the active layer is formed as a quantum well.

By providing continuous emission along the entirety of each of the channels, a continuous and uniform emission of polychromatic light is provided. By adjusting the thickness of the active layer, the emission efficiency of the LED may be optimized. Further, by varying the ratio of the active layer window region relative to the phosphor, the color of the light may be adjusted for the particular application. In this instance, "window region" refers to the opening through which electrons from a first electrode enter the active layer.

The structures of the various embodiments may be fabricated in a number of ways, depending on whether a conductive or insulative substrate is preferred, and also depending on whether insulating structures are to be formed to control the sizes of the window regions. Various substrates may be used: gallium nitride (GaN), silicon (Si) and silicon carbide (SiC) are examples of conductive substrates, while sapphire is one example of an insulating substrate. The invention is not limited to any particular substrate.

In a first fabrication process involving a conductive substrate, a GaN substrate is provided. A GaN buffer layer is formed thereon, and above that is formed a first and a second GaN cladding layer. An active layer, typically of InGaN material, is formed above the second cladding layer, and a third cladding layer is thereafter formed above the active layer. Each of these layes is typically formed by metalorganic chemical vapor deposition ("MOCVD") growth, In a typical arrangement, the substrate and the first and second cladding layers are n-type material, while the third cladding layer is p-type material. The use of n-type or p-type material may be switched if desired as long as layers of like type remain of like type.

Following the MOCVD or MBE growth of the various layers, the structure is dry etched to form ridges. Phosphor is then deposited in the channels between the ridges. Electrodes are then formed by evaporation on the bottom of the substrate and at the top of the ridges. Depending on the particular effects desired, the electrodes at the top of the ridges may be all connected, or may be selectively connected. In the event an insulating substrate is used, the first cladding layer may be revealed by etching, and the lower electrode formed thereon to permit conduction.

If silicon or silicon carbide substrates are to be used, an aluminum nitride (AlN) buffer layer is typically substituted for the GaN buffer layer in the above process.

In the event window regions are to be formed below the ridges, the fabrication steps are very similar to those shown above, except that a silicon dioxide growth is formed atop the first cladding layer, and is then etched to form window regions. The second cladding layer, active layer, and third cladding layer are then formed as above. Appropriate phosphors are then deposited into the channels formed between the LED ridges, and the electrodes are evaporated as discussed above.

The details of the flat panel light source of the present invention will be better appreciated from the following detailed description of the invention, taken together with the appended Figures.

THE FIGURES

FIG. 1 shows a prior art blue LED.

FIG. 2 shows a prior art blue LED having formed thereon a YAG phosphor layer.

FIG. 3 shows a prior art solid state light panel.

Figure 10A:
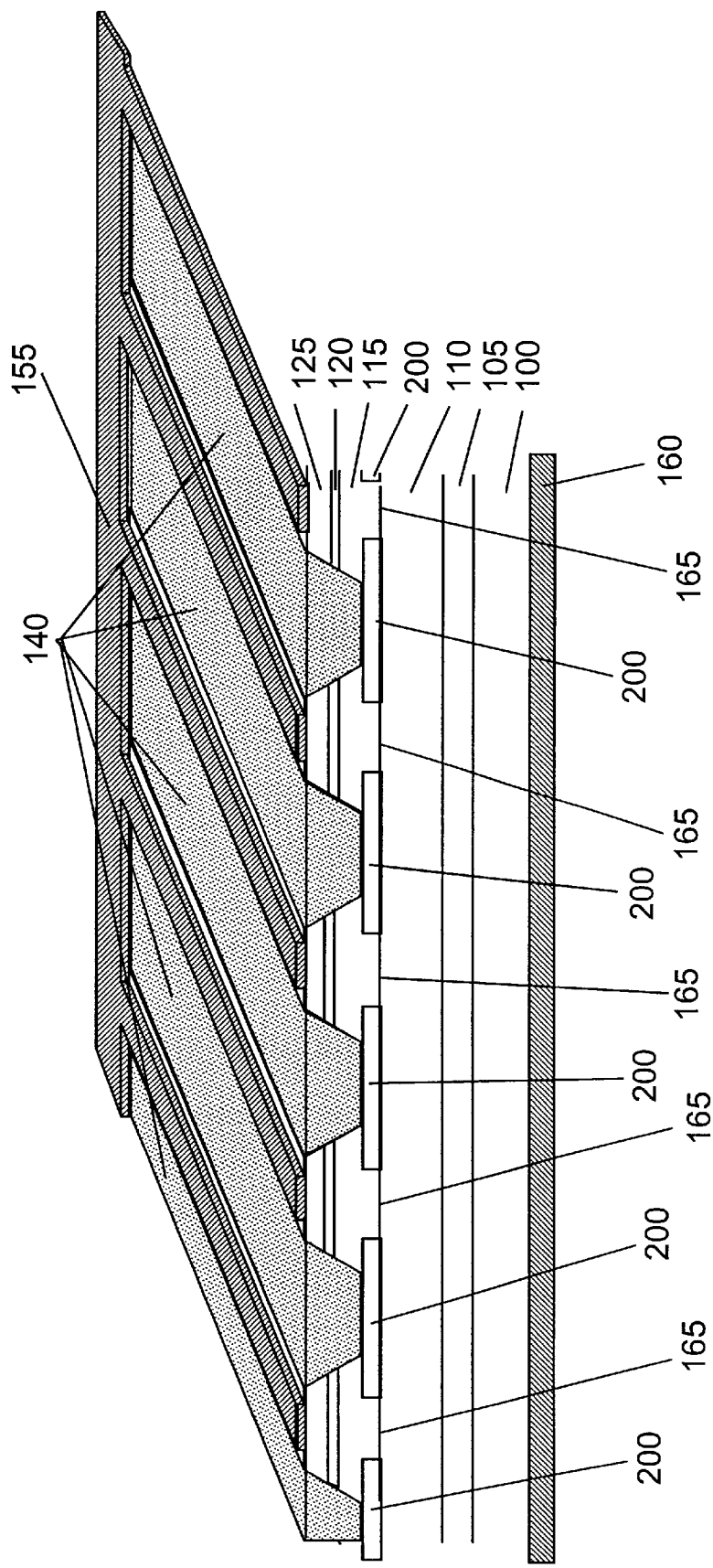
FIG. 10A shows a second embodiment of the invention similar in structure to that shown in FIG. 4, but in which a silicon dioxide insulating layer is formed above the first cladding layer to adjust the size of the window regions.
Figure 10B:
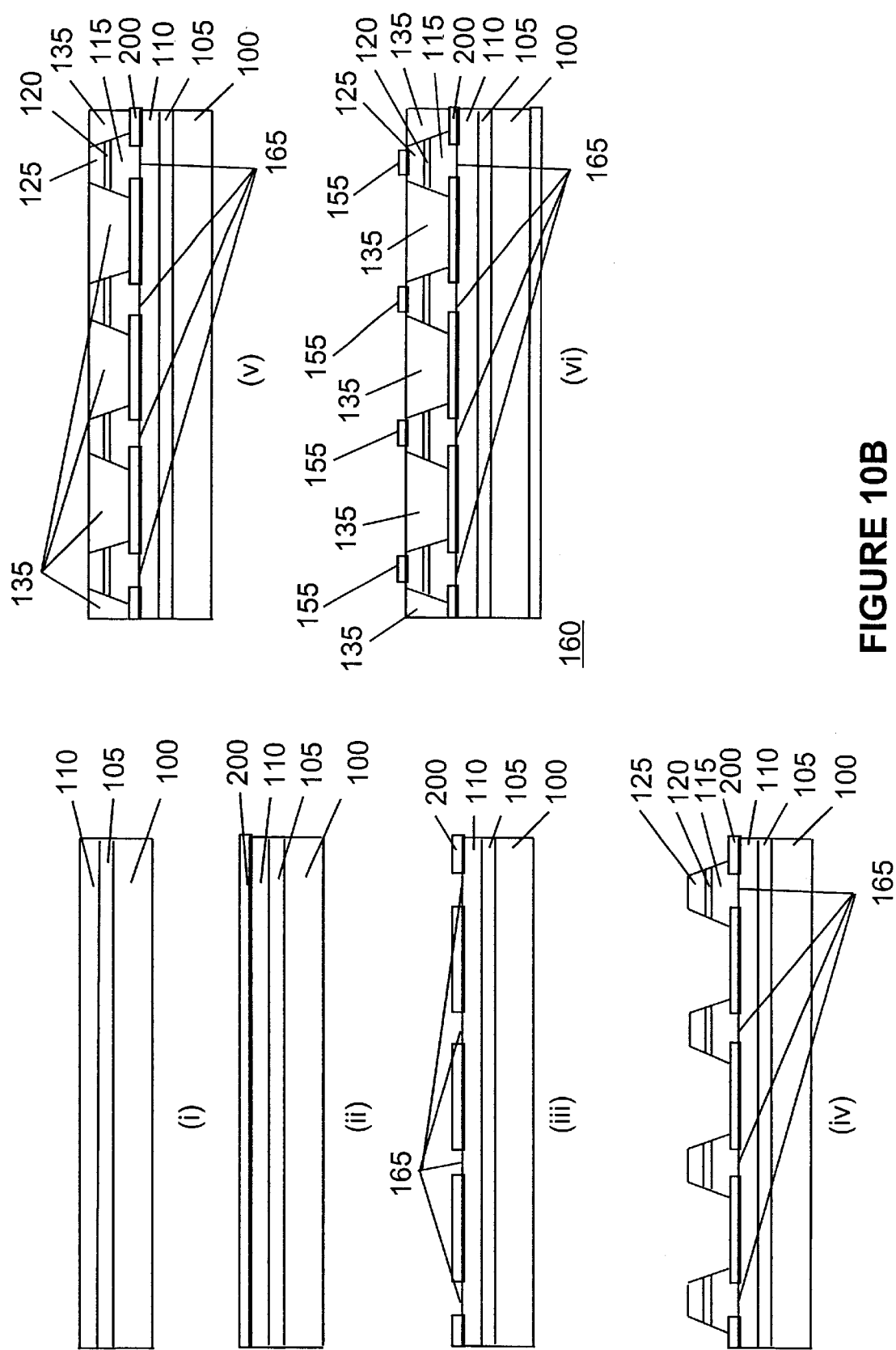
FIG. 10B shows a second fabrication process used for forming structures in accordance with the embodiment shown in FIG. 10A.
Figure 11:
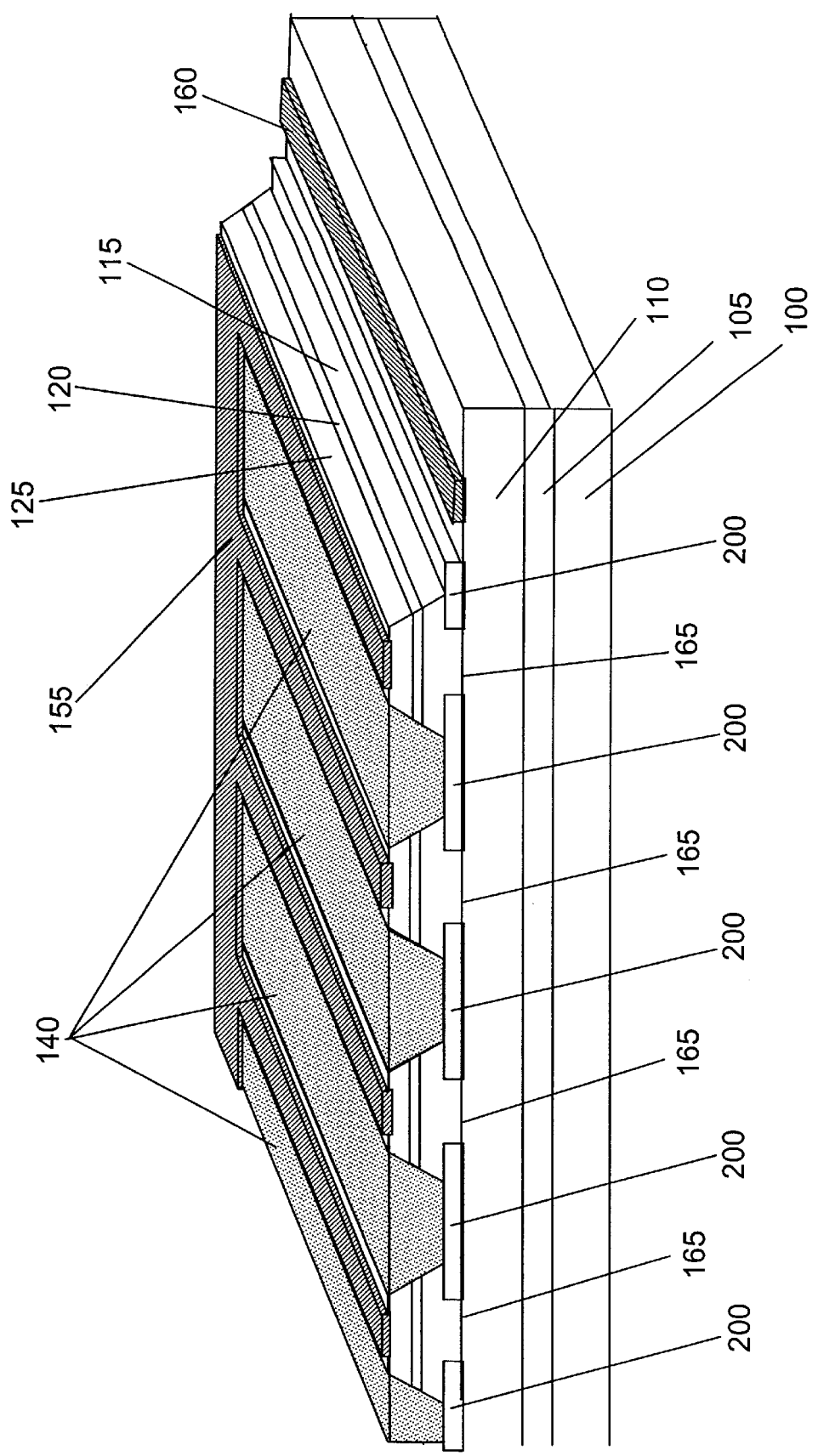

Figure FIG. 11 shows an alternative to the second embodiment of the invention shown in FIG. 10, but instead using an insulating substrate.

Figure 12A:
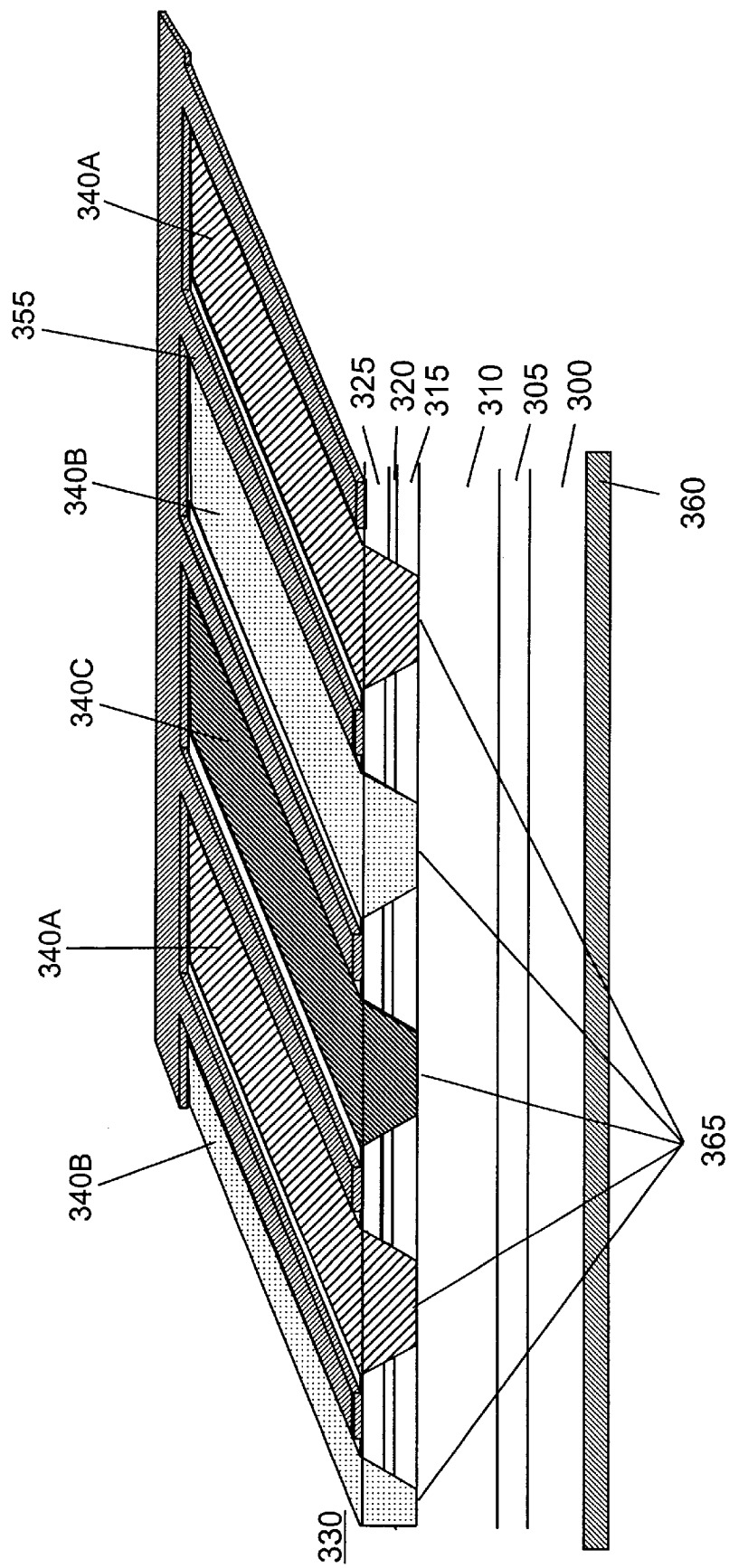

FIG. 12A shows a third embodiment of the invention in which ridges of ultraviolet LEDs are formed on a conductive substrate, with red, green and blue phosphors deposited therebetween in sequence.

Figure 12B:
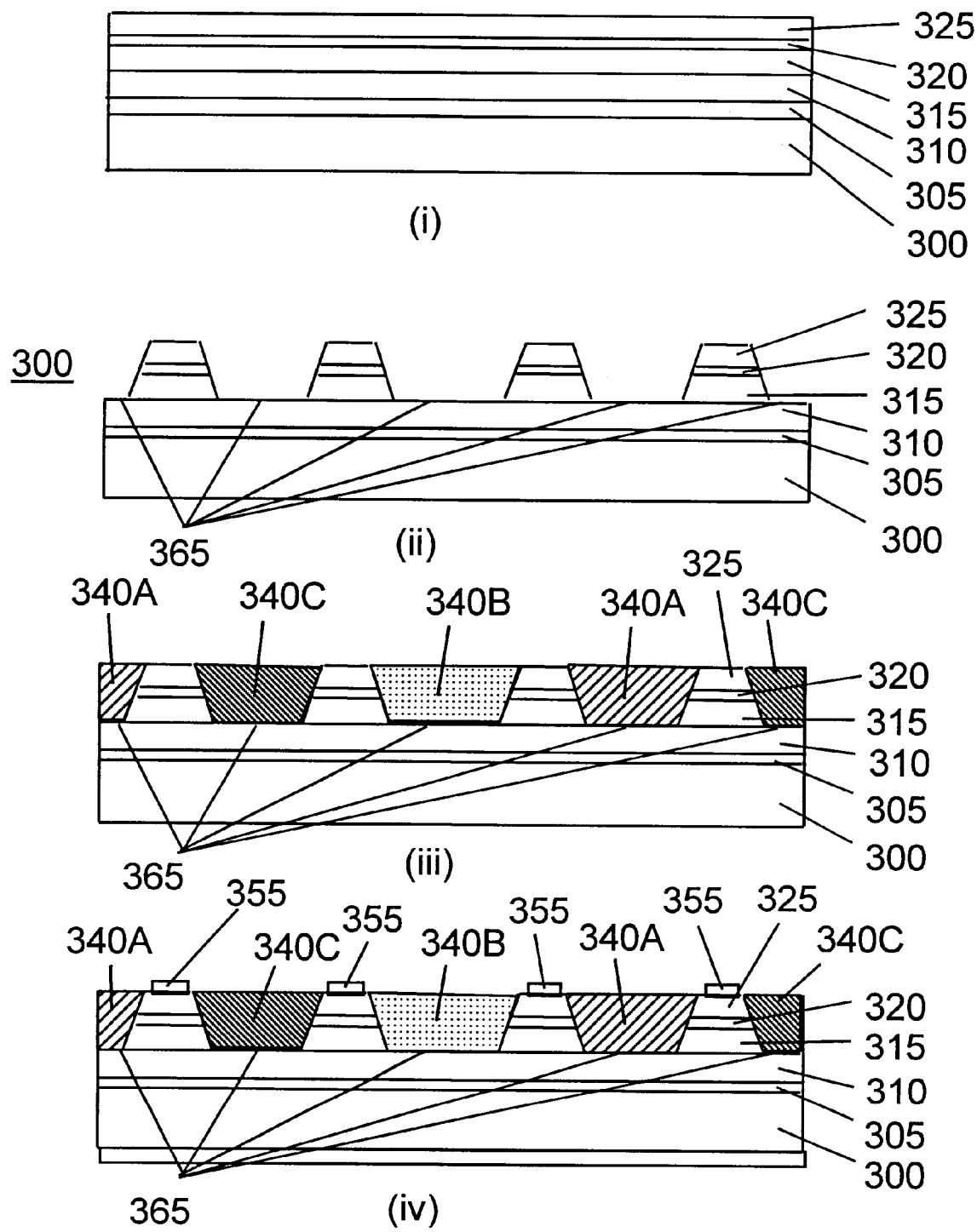

FIG. 12B shows a third fabrication process used for forming structures in accordance with the embodiment shown in FIG. 12A.

Figure 13:
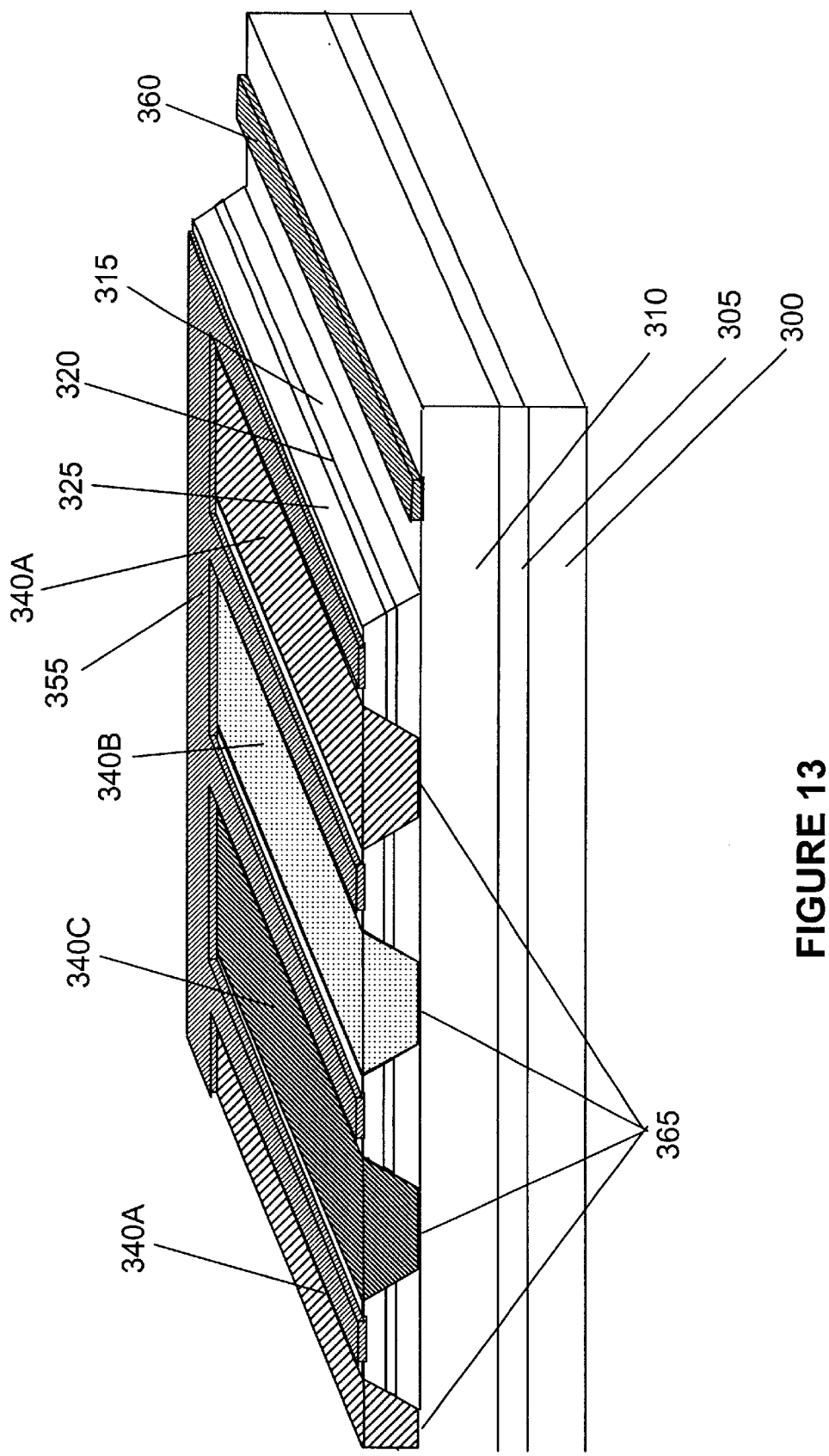

FIG. 13 shows a variation of the third embodiment, in which an insulating substrate is used.

Figure 14A:
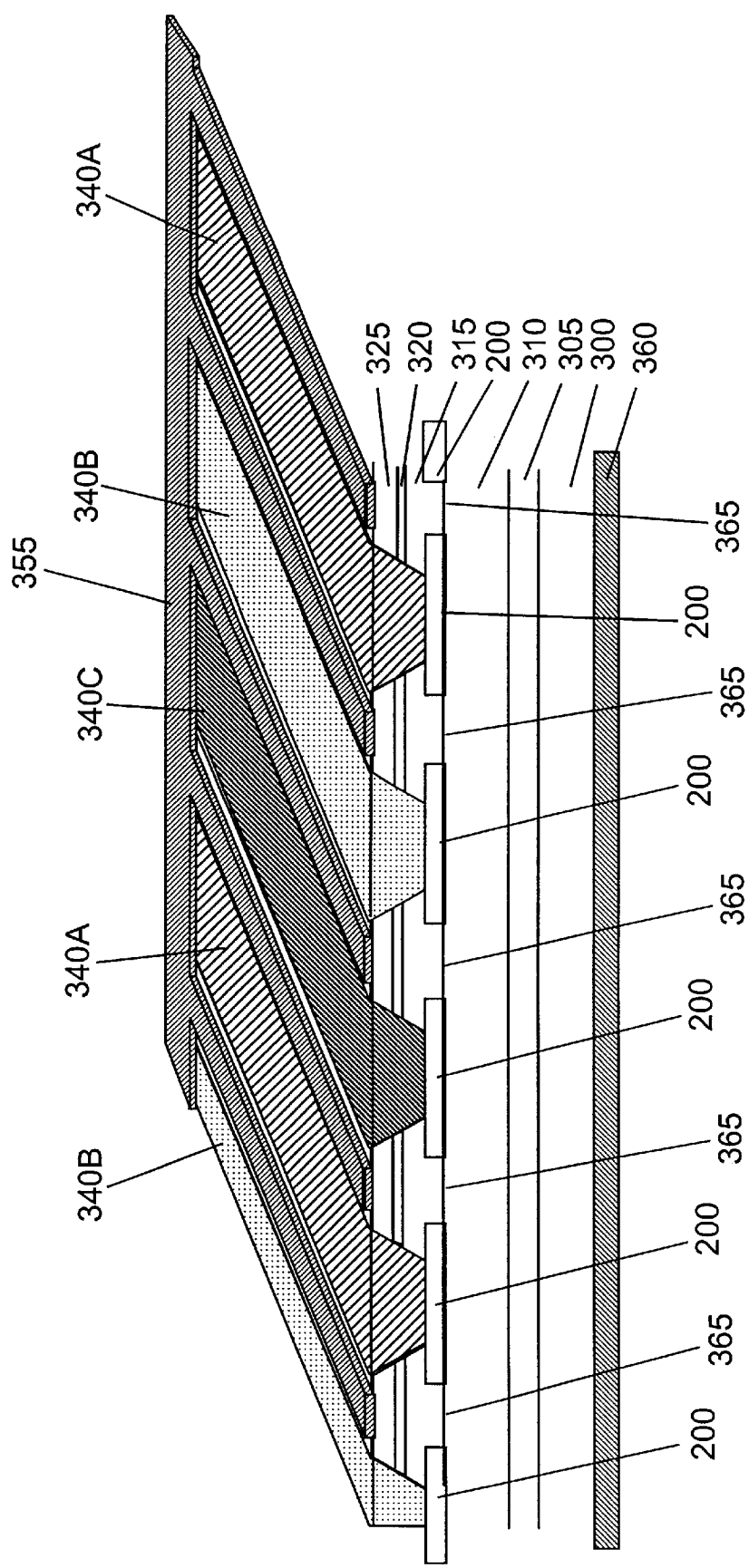

FIG. 14A shows a fourth embodiment of the invention, where an $SiO_2$ layer is formed to control the window regions, but with the alternating red, green and blue phosphors of the third embodiment.

Figure 14B:
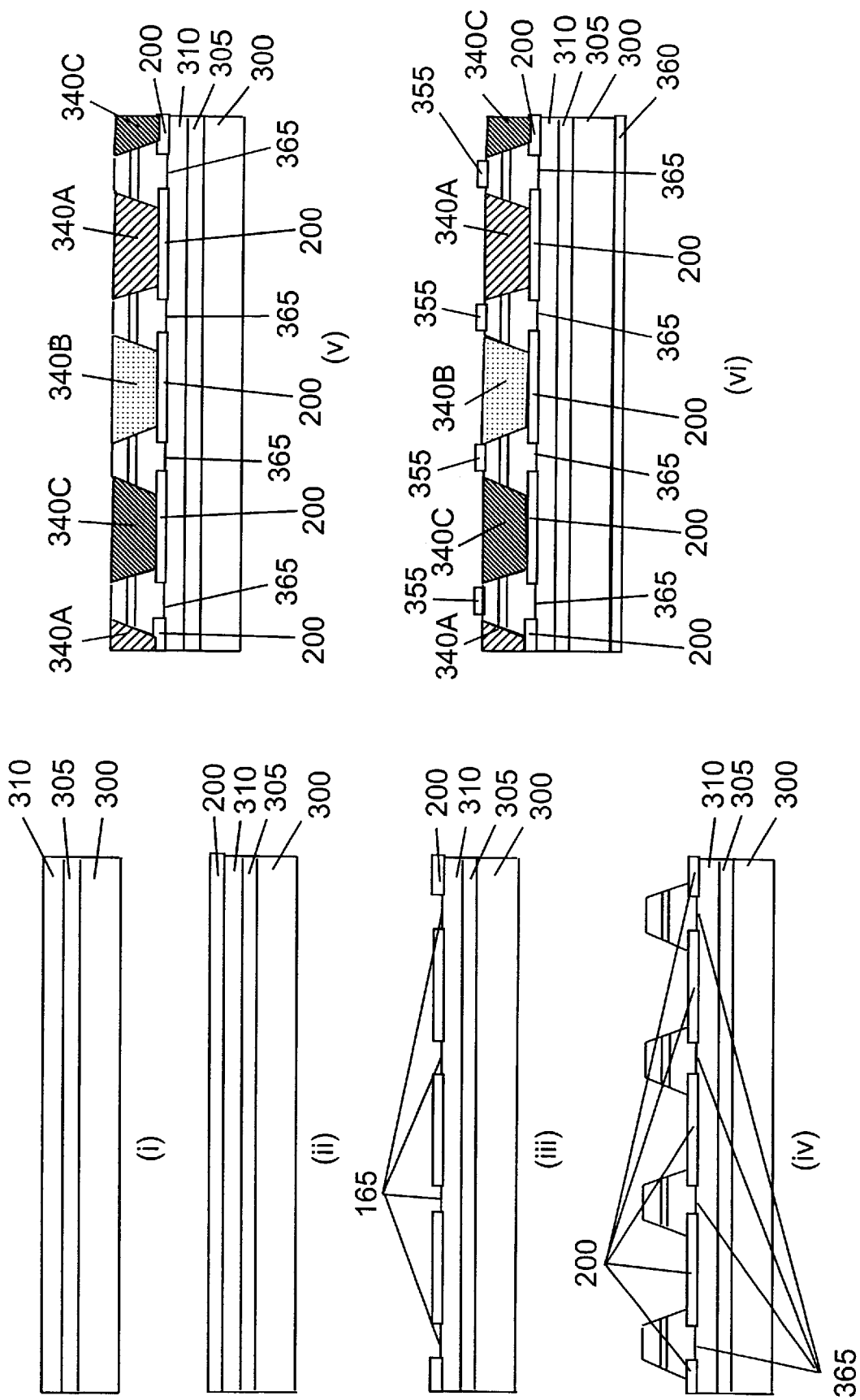

FIG. 14B shows a fourth fabrication process used for forming structures in accordance with the embodiment shownin FIG. 14A.

Figure 15:
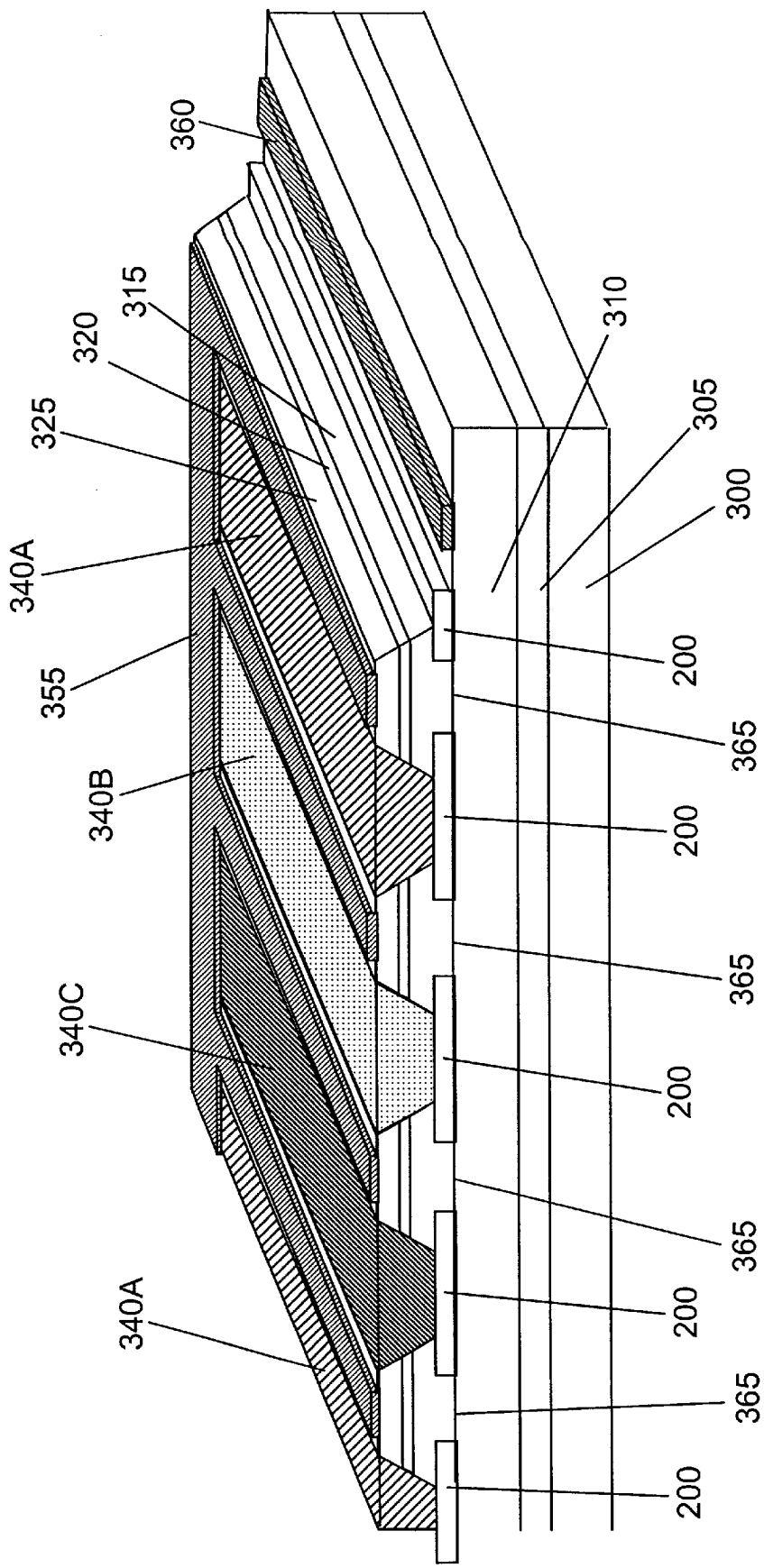

FIG. 15 shows a variation of the fourth embodiment, in which an insulating substrate is used.

Figure 4:
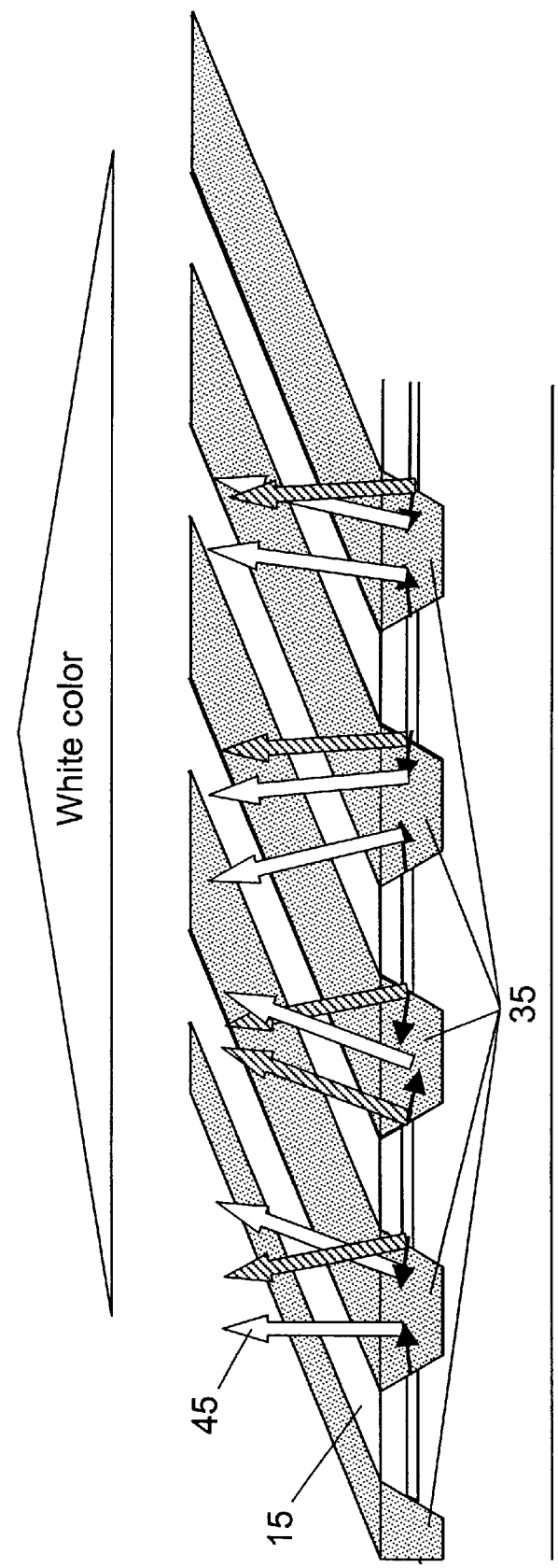
FIG. 4 shows a first embodiment of a uniform emission LED in which a yellow phosphor is deposited between ridges of blue LEDs using a conductive substrate.

FIGS. 16A–E show various shapes which may be formed from a single panel of the light source of the present invention using the single-phosphor approach of FIG. 4.

Figure 5:
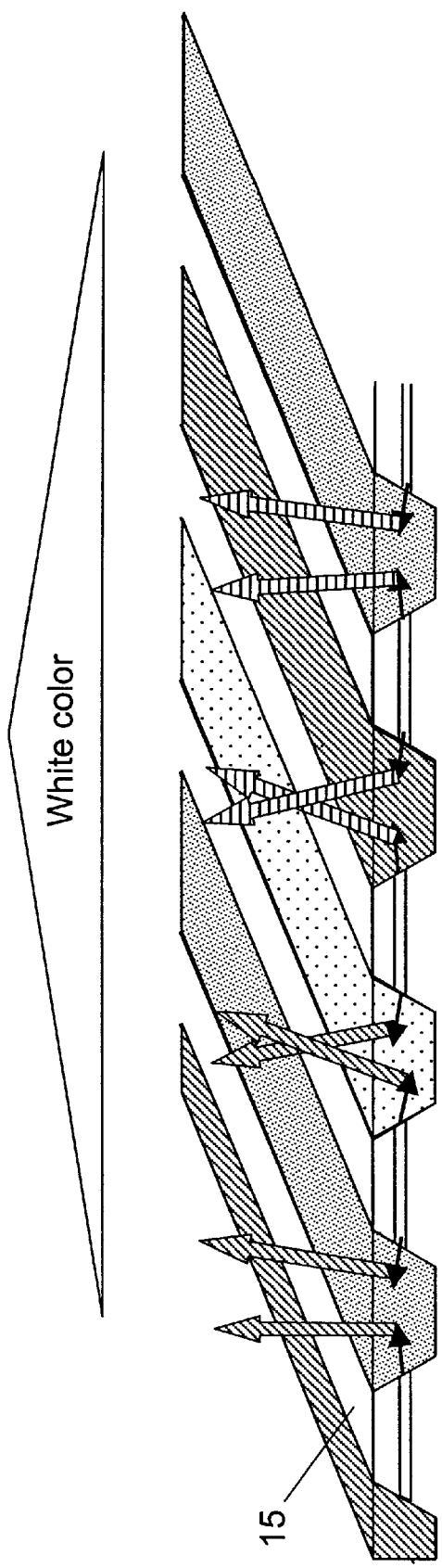
FIG. 5 shows a second embodiment of a uniform emission in which red, green and blue phosphors are deposited between ridges of ultraviolet LEDs.

FIGS. 17A–D show various shapes which may be formed from a single panel of the light source of the present invention using the multiple-phosphor approach of FIG. 5.

Figure 18:
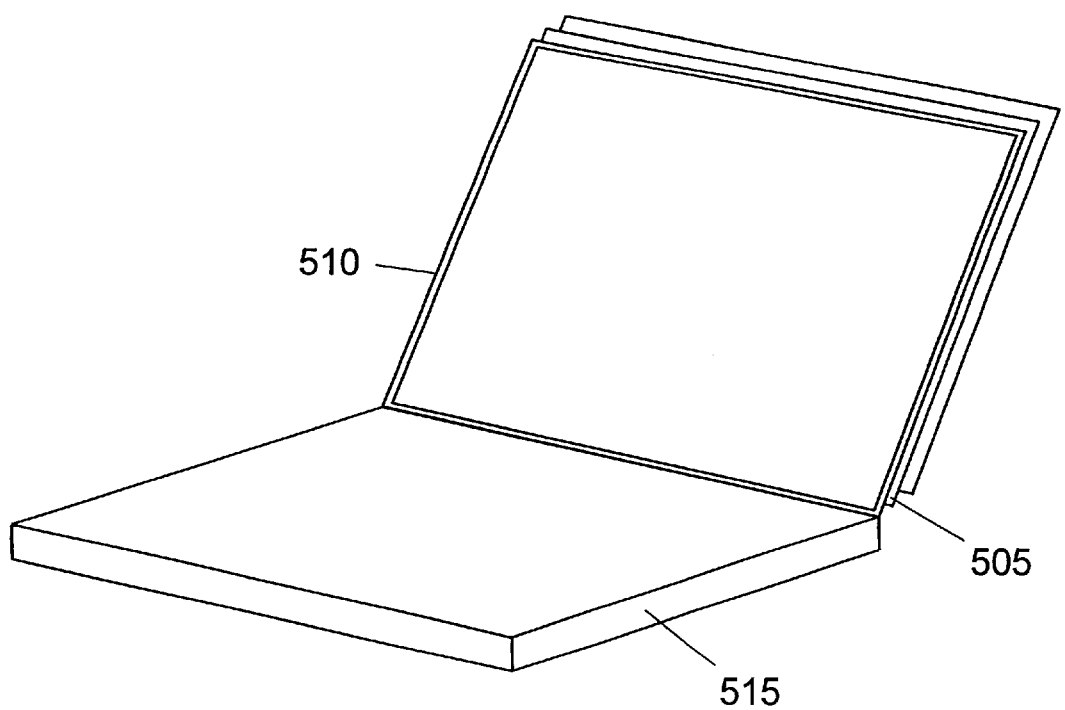

FIG. 18 shows an LED array in accordance with the present invention used as a backlight for flat panel displays.

Figure 19:
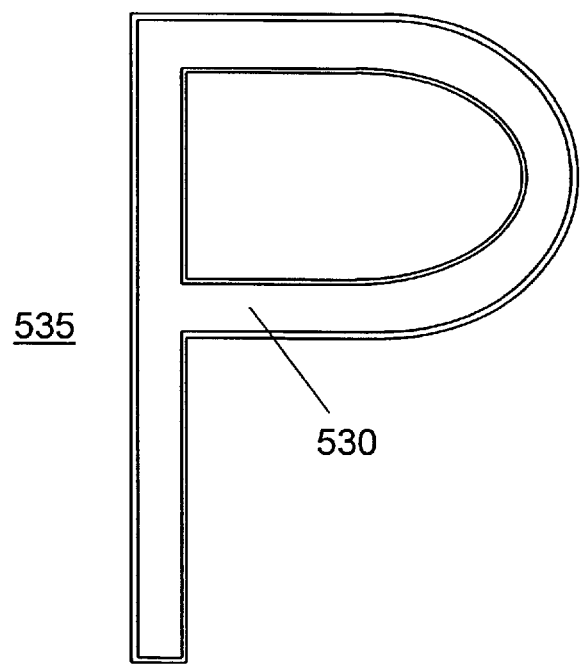

FIG. 19 shows the LED structure of the present invention used to create an alphanumeric character.

Figure 20:
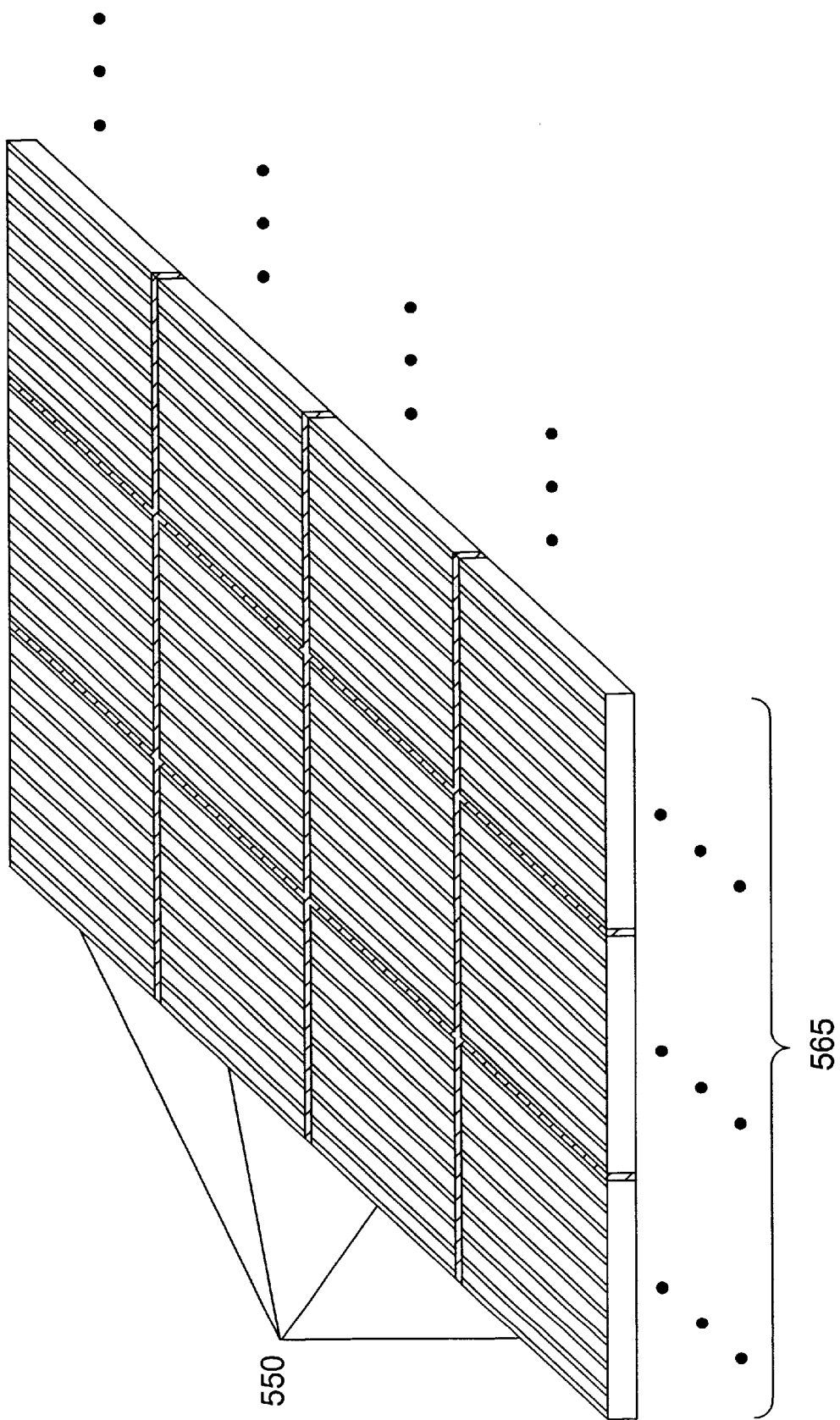

FIG. 20 shows a plurality of units of the LED array to form an ambient light source.

DETAILED DESCRIPTION

Referring first to FIG. 4, a generalized embodiment of the present invention may be better understood in which a single type of phosphor is used. In simplified terms, a plurality of LED active layers 5 are formed on a substrate indicated generally at 10 and bounded above and below by cladding layers of opposite conduction 15 and 20, respectively, to form a plurality of ridges 25. Passage of a current through the active layer causes carrier injection into the active layer which leads to emission of light of a first frequency, indicated at 30, when holes and electrons recombine. The light 30 emits from the active layers 5 into a phosphor 35 deposited in channels 40 formed between the ridges 25. The light 30 excites the phosphor, in turn causing the phosphor 35 to emit light 45 of a second frequency. By carefully controlling the quantum efficiency of the first frequency light 30 and second frequency light 45, polychromatic light ultimately perceived by a viewer may be of a selected resultant frequency. For example, for a blue LED with a yellow phosphor, the combination of blue and yellow emissions may be controlled to yield white light. In a typical arrangement, the active layers 5 may be $In_xGa_{1-x}N$ material wherein x define the InN mole fraction, while the cladding layers 15 and 20 are of opposite conduction types. The phosphor is typically YAG in such an embodiment.

Referring next to FIG. 5, a generalized embodiment may be understood, again in simplified terms, in which a plurality of phosphors are used with the combined emitted light providing the desired spectrum. For clarity, elements similar to those shown in FIG. 4 are indicated with like numerals. In the embodiment of FIG. 5, a plurality of active layers 5 may again be formed on a substrate generally indicated at 10. The active layers 5 are again bounded above and below by cladding layers 15 and 20 of opposite conduction. Unlike the embodiment of FIG. 4, however, the active layer of FIG. 5 is typically $Al_xGa_{1-x}N$, where x is again the AlN mole fraction. In at least some implementations of such an embodiment, each cladding layer will also have a different mole fraction, discussed in greater detail hereinafter in connection with FIG. 12. The cladding layers and active layer again form ridges 25, with ultraviolet light typically emitted by recombination of carriers within the active regions. The active layers emit light into a plurality of phosphors 35A–C deposited into the channels 40 formed between the ridges 25. The excitation of the phosphors 35A–C by the light 30 causes the emission of red, green and blue light from the respective channels.

By controlling the light emitted from the plurality of channels to be approximately uniform in emission power, the impression of a uniform panel of white light is created. It will also be appreciated that light is emitted across the entirety of the channels, which are typically wider at their upper surface 50 than the upper surface of the ridges 55. By varying either the current applied, the size of the channels or windows, and the selective activation of the LEDs, polychromatic adjustment may be readily obtained; likewise, adjustment of luminance is also possible. It will further be appreciated that the substrate is typically only a few micrometers thick, but the emission area size is determined only by the area size of the substrate. In addition, a plurality of such devices can be combined on a single backplane to yield an exceptionally large light emitting panel.

In most embodiments of the present invention, the use of a quantum well active layer will be helpful. The benefits from using a quantum well structure in the active layer can be appreciated from the following: The lattice constants of InGaN and GaN are different from each other, such that an InGaN layer with a thickness larger than the critical thickness grown on GaN has defects to release the strain energy generated by the difference between the lattice constants. Such defects cause poor conversion efficiency from the injected current to the emitted light because defects act as nonradiative recombination centers. In contrast, the quantum well structure of the present invention comprises at least one thin layer in the range of several tens of angstroms, with the benefit that defects are not formed in such thin layers. This permits the reduction of defect density in the active layer, leading to high conversion efficiency from the injected current to the emitted light.

Figure 6:
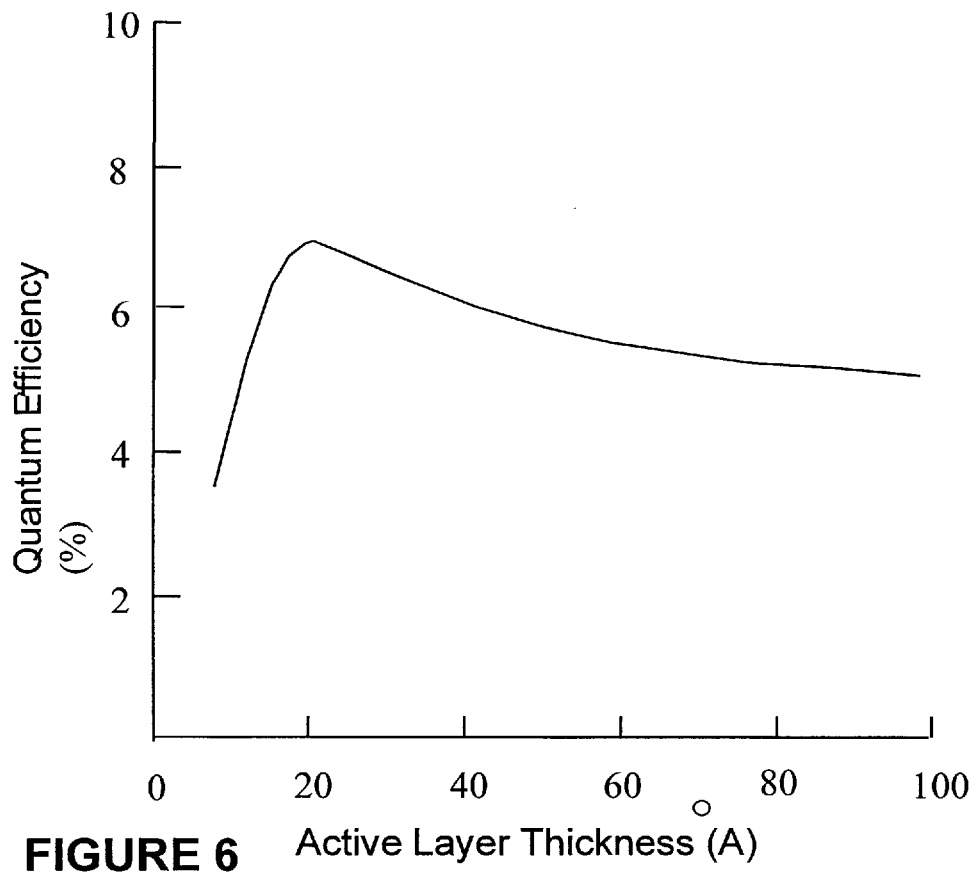
FIG. 6 shows a plot of quantum efficiency relative to active layer thickness.

In the case of an undoped active layer, the output power is proportional to the product of the electron density and the hole density in the active layer. To increase the electron density and the hole density in the active layer, the utilization of a thin active layer is effective because the carriers are injected into a region with a small volume. This, in turn, leads to an increased carrier density in the active layer. Therefore, the utilization of a quantum well active layer is effective to obtain LEDs with high quantum efficiency. In contrast, however, in a thin active layer the injected carriers have a tendency to overflow from the active layer to the cladding layer, which leads to the decrease of the conversion efficiency from the injected current to the output power. As a result, it is desirable to optimize the thickness of the active layer to permit maximizing quantum efficiency. FIG. 6 plots the experimental results of conversion efficiency dependence on active layer thickness for a device such as shown in FIGS. 4 or 5 with a cavity length of five centimeters and a stripe width of 40 μm. As can be seen, while a wide range of active layer thicknesses will yield acceptable results, the highest quantum efficiency in the current structure is achieved with an active layer thickness on the order of 20 Angstroms, the most suitable thickness exists. FIG. 6 shows the experimental results of the conversion efficiency dependence on the active layer 5 thickness in the case of a LED with cavity length of 5 cm and stripe width of 40 μm. As shown in FIG. 6, the highest quantum efficiency of seven percent (7%) is obtained where the thickness of the active layer 5 is on the order of 20 Å. Therefore, the thickness of the active layer 5 is typically set to be on the order of 20 Å, although the thickness may vary between fifteen and forty-five Angstroms in some embodiments, and may be thinner or thicker for other materials.

Figure 7:
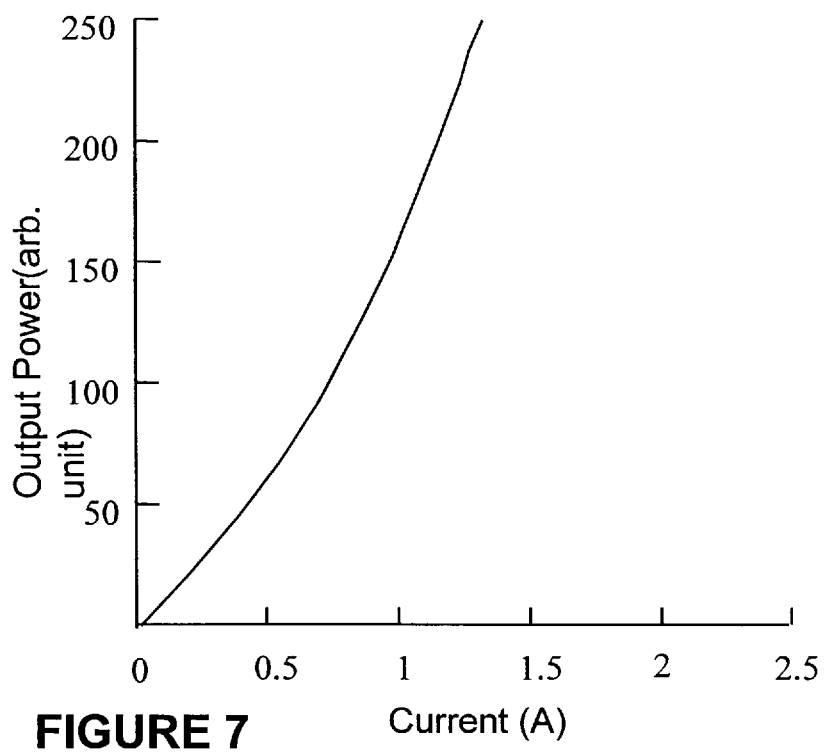
FIG. 7 shows a plot of output power relative to current.

Another factor in the emission power of the present invention is current. With reference to FIG. 7, the increase in output power can be seen relative to applied current in amps. For example, an output power of 160 mW results from an injected current of one amp, making it possible to obtain white light as well as other frequencies.

Figure 8A:
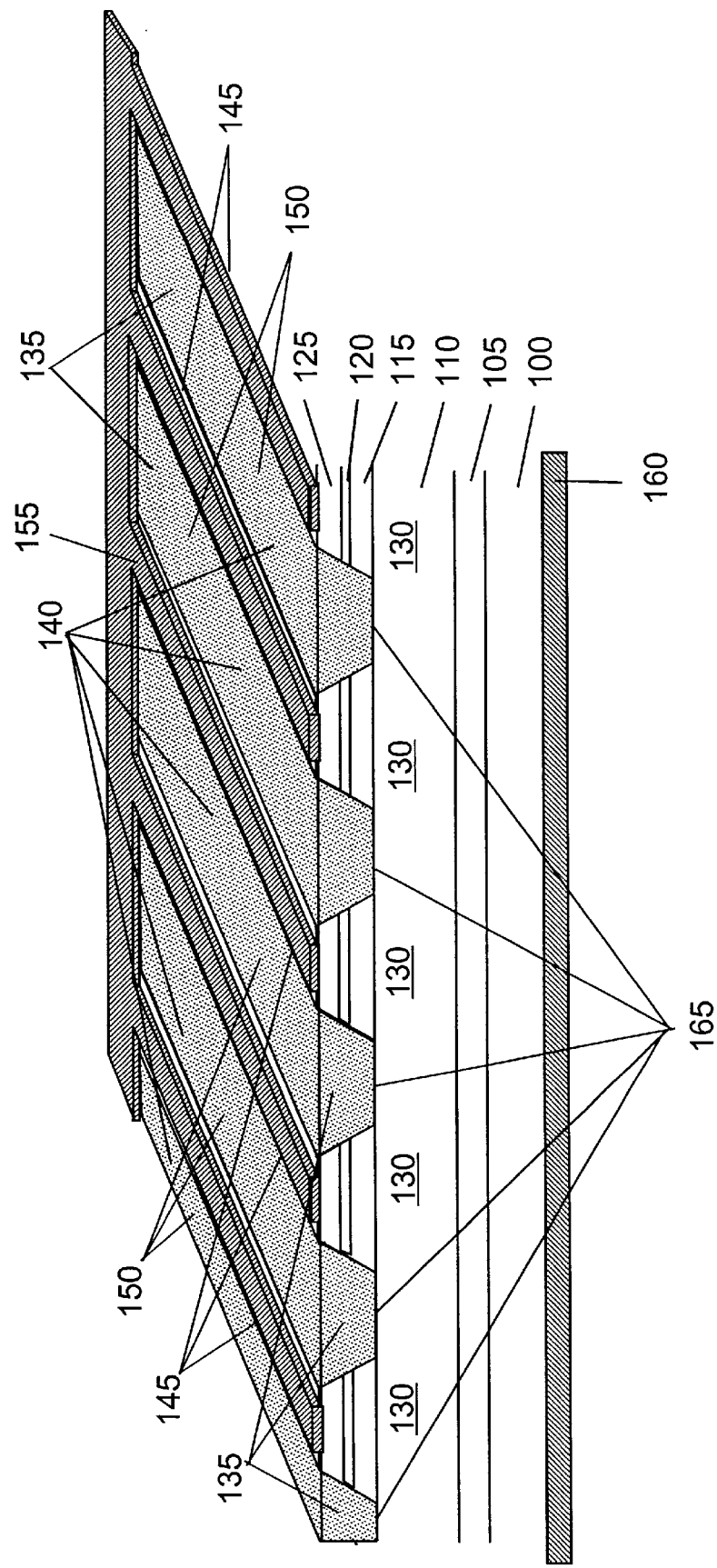
FIG. 8A shows in cross-section the layers forming the structure shown in FIG. 4.
Figure 8B:
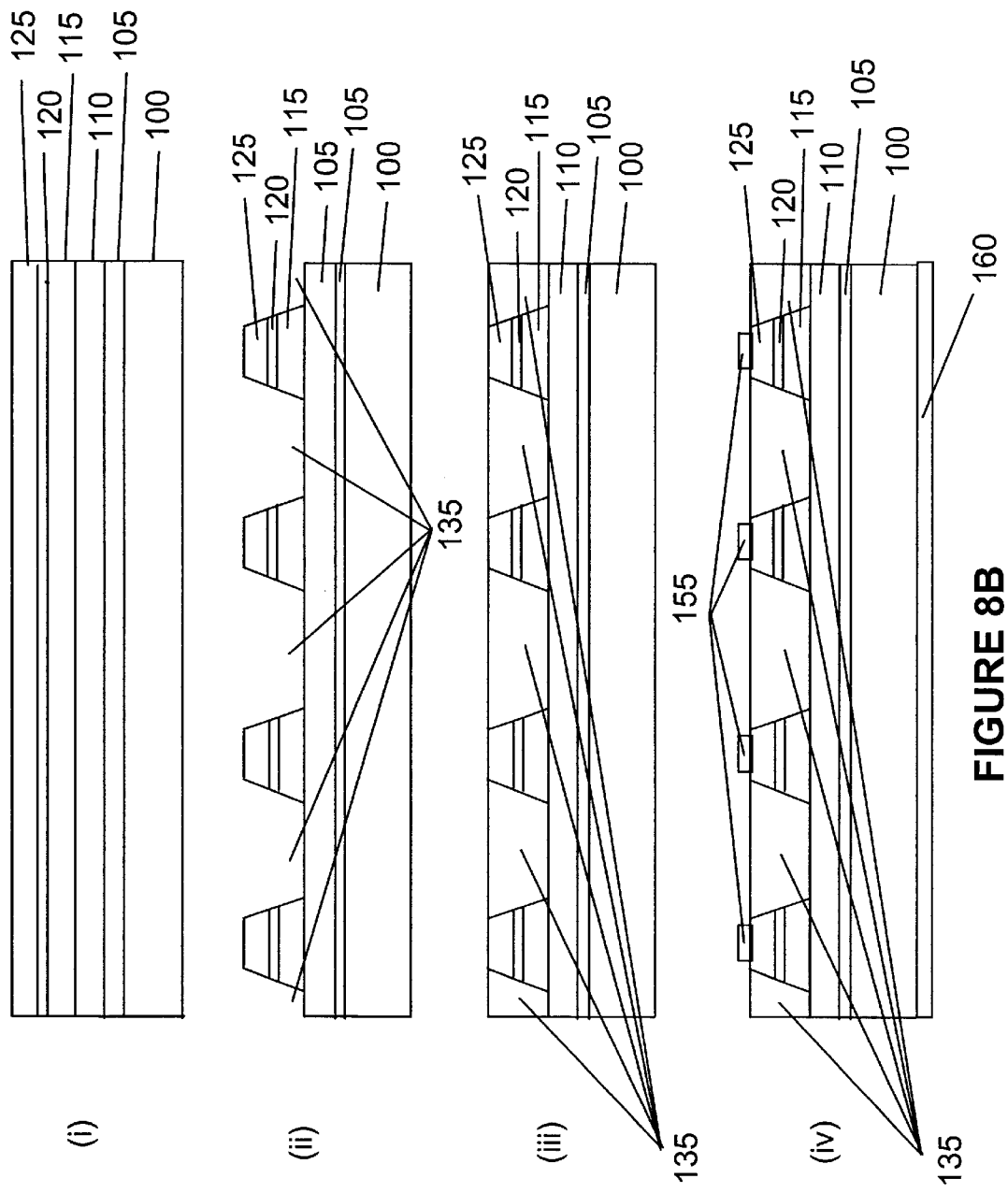
FIG. 8B shows a first fabrication process used for forming structures of the type shown in FIG. 8A.

Referring next to FIGS. 8A and 8B, the structure of a first embodiment based on the structure of FIG. 4 may be better understood. A conductive substrate 100 of a first conduction type is provided, and a buffer layer 105, preferably of the same conductivity type, is layered above it. Then, a first cladding layer 110 of the same conduction type is grown thereon, typically by MOCVD or MBE growth, followed by the growth of a second cladding layer 115 of the same conduction type. An active layer 120 is thereafter grown, after which a third cladding layer 125 of an opposite conduction type is formed above the active layer. This results in the active layer 120 being sandwiched between cladding layers 115 and 125 of opposite conduction types.

Portions of the upper layers are then selectively etched to expose the first cladding layer, thereby form ridges 130 of the third cladding layer 125, the active layer 120 and the second cladding layer 115. Channels 135 are likewise formed between the ridges 130. A phosphor 140 such as YAG is then deposited into the channels 135 until they are substantially filled. It will be appreciated that the dry etch process causes the ridges to be narrower at their upper surfaces 145 than the upper surfaces 150 of the channels 135. Thereafter, a first electrode 155 is deposited onto the upper surfaces 145 of the ridges, while a second electrode 160 is deposited onto the back of the conductive substrate 100. It will be appreciated that the size of the window regions, which are formed at the junction of the second cladding layer to the first cladding layer, are controlled by the width of the second cladding layer at that junction.

The particular material used for conductive substrate 100 may vary depending on the application of the device: By using a GaN substrate, the difference between the lattice constants of the GaN first cladding layer 110 and the substrate 100 is eliminated. This leads to reduced defect density in the GaN first cladding layer, which in turn directly relates to a reduced defect density in the active layer. The overall result is increased emission efficiency. Alternatively, a silicon substrate may be desirable since silicon substrates permit a large area size with low resistance. This results in a large area size panel with reduced operating voltage. In other embodiments, where heat is an issue, it may be desirable to use a silicon carbide (SiC) substrate. By using a SiC substrate, a low resistance and high heat conductivity substrate are easily obtained, reducing both the operating voltage and heat generation.

In the event a gallium nitride substrate is used, an exemplary and presently preferred embodiment of the structure of FIG. 8A will use an n-type substrate, together with an n-type buffer layer about 0.5 μm thick as well as first and second cladding layers, each of which may be on the order of 2 μm thick. The active layer is typically comprised of $In_xGa_{1-x}N$ material about 20 angstroms thick, where x is the mole fraction of Indium. In order to emit blue light with a wavelength range of 450 nm from the active layer, the InN mole fraction in the active layer 5 is typically on the order of 0.05. The third cladding layer is typically p-type GaN material, or of opposite conduction type to the other cladding layers, and also about 2 μm thick. It is not in all instances critical whether the third cladding layer is p-type or n-type, as long as it is opposite to the remaining cladding layers. The objective is to induce carrier injection into the active layer. The various layers may be grown by, for example, the MOCVD or MBE methods or any other suitable method. The phosphor is typically YAG material, such that the LEDs emit blue light which in turn excites the YAG to emit yellow light in about the 600 nm range. The combined blue and yellow light result in the overall emission of white light along the entire surface of the channels. The effect is to provide the impression of a panel emitting white light across the entire surface.

In those embodiments where a silicon or silicon carbide substrate is desirable, it is not typically preferred to layer gallium nitride directly onto the such substrates. In these embodiments, aluminum nitride may be used as the buffer layer, with the cladding and active layers remaining the same as discussed above for a GaN substrate. While the remaining layers are typically about the same thickness as discussed above, the n-type AlN buffer layer may be on the order of 100 Å. The size of the substrate may be on the order of 10 cm in length and breadth. The width of the window region 165 and the third cladding layer 125 are set to be 60 μm and 40 μm, respectively.

In some instances, it may be desirable to use an insulative substrate instead of the conductive substrates discussed in connection with FIGS. 8A and 8B. By using a sapphire substrate, a high quality GaN layer is easily obtained by introducing a low temperature grown GaN buffer layer at the initial stage of the crystal growth process. However, because sapphire is an insulator, the second electrode must be formed in a location which permits conduction to the second cladding layer. In this event, as can be appreciated from FIG. 9, a portion of the upper cladding layers and active layer are etched away to expose the first cladding layer. The second electrode 160 is then formed on the exposed portion of the first cladding layer. The structure is otherwise similar to that shown in FIGS. 8A and 8B.

Referring next to FIGS. 10A and 10B, a second embodiment of the present invention may be better appreciated. For clarity as well as simplicity, elements of like type with the structure of FIGS. 8A and 8B have been given like numerals and will not be described again. The embodiment of FIGS. 10A–10B provides ridge formation by selective growth, and differs from that shown in FIGS. 8A–8B only in the addition of $SiO_2$ structures 200 between the first and second cladding layers 110 and 115 at the location of the ridges 130. The $SiO_2$ layer is grown following the growth of the first cladding layer, after which the $SiO_2$ layer (which is typically on the order of 300 Å thick) is etched to form window regions at the junctions between the second cladding layer and the first cladding layer. The remaining layers are then grown and etched in a manner substantially similar to that discussed above in connection with FIGS. 8A–8B. Various substrates may be used in a manner identical to that discussed above in connection with FIGS. 8A and 8B.

Figure 9:
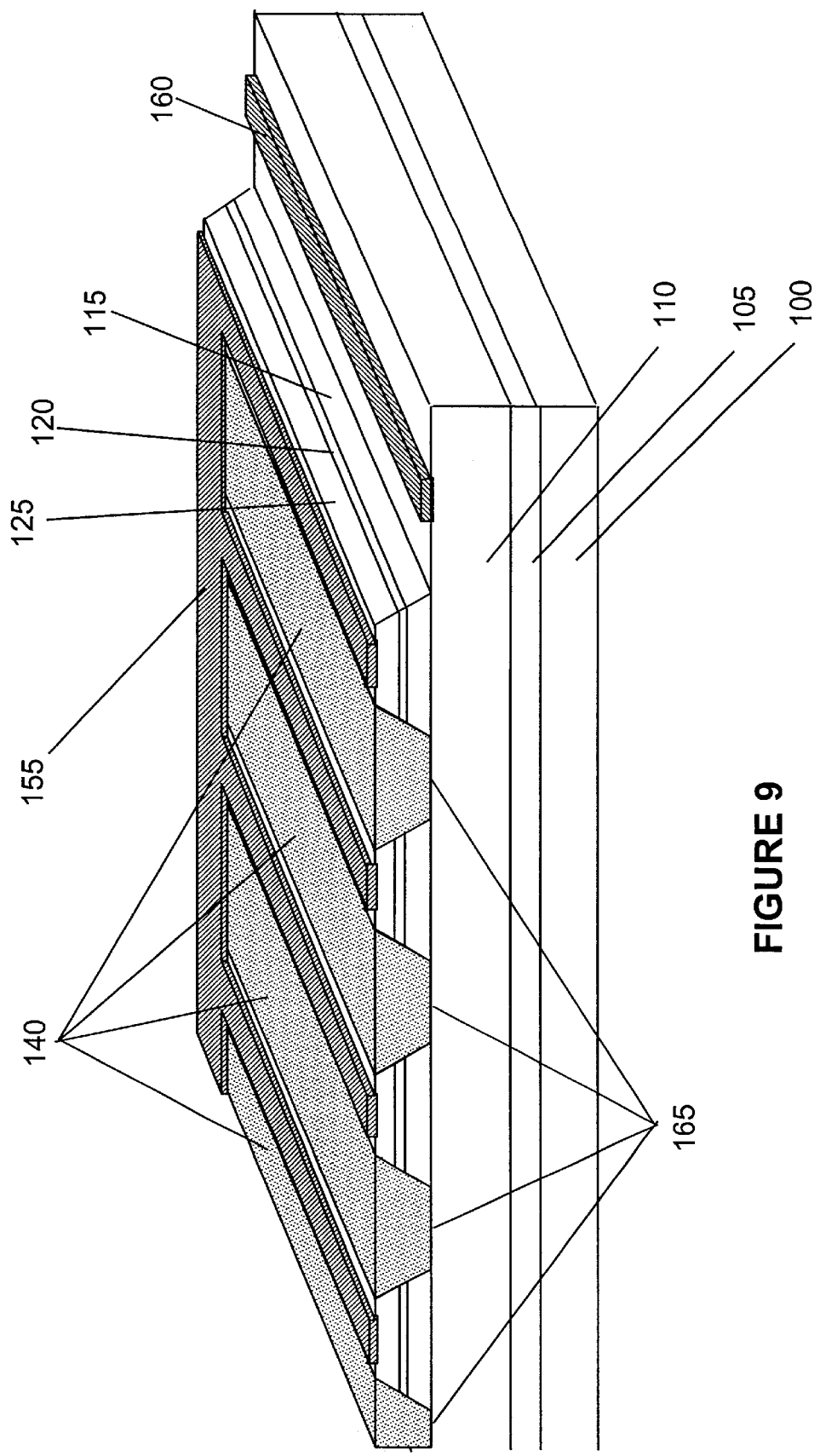
FIG. 9 shows an alternative to the first embodiment of the invention shown in FIG. 4, but in which an insulating substrate is used.

Referring next to FIG. 11, an insulative substrate is shown, similar to that described in FIG. 9, but with the window region structure shown in FIGS. 10A–B. As with the prior figures, elements which function the same are assigned the same numerals for clarity. As discussed above, the $SiO_2$ layers are formed to control the windowing regions of FIGS. 10A–B with the additional step of removing the $SiO_2$ layer and, later in the process, the cladding layers, over the area in which the electrode 160 is to be formed.

Referring next to FIGS. 12A and 12B, a third embodiment of the present invention is shown both structurally and in the process steps required to create it. The third embodiment is shown generally in FIG. 5 and differs from the embodiments shown in FIGS. 8A–8B and 10A–10B primarily in the use of ultraviolet LEDs together with phosphors designed to emit red, green and blue light. The embodiment of FIG. 12A begins with a conductive substrate 300 of a first conduction type, on which is grown a buffer layer 305 of the same conduction type. A first cladding layer 310 of the same conduction type is thereafter grown, followed by a second cladding layer 315. An active layer 320 is then grown atop the second cladding layer, followed by the growth of a third cladding layer 325. The structure is then selectively etched, typically by dry etching, down to the first cladding layer to form ridges 330. The formation of the ridges 330 also forms channels 335 therebetween, into which is deposited one of three phosphors 340A, 340B or 340C. The phosphors 340A–C preferably are sequenced so that they occur in a repeating pattern across the array, and are designed to emit light (when excited by emissions from the LEDs) which can be combined to form white light; for example, blue red, and green light. As with the structure of FIG. 8A, the tops 345 of the ridges 330 are narrower than the upper surface 350 of the phosphor deposition. One or more upper electrodes 355 are formed atop the upper surfaces 345, and a lower electrode 360 is formed on the opposite side of the conductive substrate 300. As with FIG. 8A, the junction of the first cladding layer 110 and second cladding layer 115 forms window regions for the injection of carriers into the active layer.

To cause the phosphors to emit the desired spectra, the LEDs formed by the active layer structure typically emit ultraviolet light. In an exemplary arrangement, this is achieved by a first cladding layer of $Al_{y1}Ga_{1-y1}N$ material of a first conduction type, a second cladding layer of $Al_{y2}Ga_{1-y2}N$ material of the first conduction type, an active layer of $Al_{ya}Ga_{1-ya}N$ material, and a third cladding layer of a conduction type complementary to the first and second cladding layers. The third cladding layer is typically comprised of $Al_{y3}Ga_{1-y3}N$ material. In each instance, $y_1$, $y_2$, and $y_3$ define AlN mole fraction for the respective layers while $y_a$ defines the mole fraction for the active layer.

In addition, the formulations of the phosphors varies from that shown in FIG. 8A. In particular, the phosphors 340A–C may be $BaMgAl_{14}O_{23}$:Eu (340A), $(Y.Ga)BO_3$:Eu (340B), and $ZnSiO_4$:Mn (340C), leading to the emission of blue light, red light, and green light, respectively. The width of the window region and the third cladding layer are set to be 60 μm and 40 μm, respectively.

As with the previous embodiments, various substrates may be used of the type and thickness previously described. In addition, in the event an insulating substrate is desired, reference is made to FIG. 13, which illustrates a version of the third embodiment having a sapphire substrate. The use of phosphors 340A–C, as shown in FIG. 12A, together with the etched area and electrode of FIG. 11, will be understood in view of the previous discussion.

Referring next to FIGS. 14A–14B, a fourth embodiment of the present invention may be appreciated. As with the differences between FIGS. 8A–8B and 10A–10B, it can be seen that FIGS. 14A–14B differ from FIGS. 12A–12B only in the addition of SiO$_2$ layer 370 which has been added to FIGS. 14A–14B through the same additional steps as discussed in connection with FIGS. 10A–10B. FIG. 15 illustrates an embodiment having an insulating substrate but otherwise configured to provide the same structure. As with the previous examples, like elements have been assigned like numerals for clarity.

Referring next to FIGS. 16A–E and 17A–D, various shapes which may be configured with a single chip of the light source of the present invention may be appreciated. The designs shown in FIGS. 16A–E use the single phosphor (135) implementation discussed in connection with FIG. 4 and the first and third embodiments, while the designs shown in FIGS. 17A–D use the multiple phosphor (340A, 340B, 340C) implementation discussed in connection with FIG. 5 and the second and fourth embodiments. Importantly, the electrodes 155 and 355, respectively, shown in FIGS. 16A and 17A may all be connected together, simplifying the design of the driving circuit because only two terminals are required.

The arrangement shown in FIGS. 16B and 17B provide maximum flexibility because each electrode 155 or 355 is separately driven. While this complicates driver design, it allows significant variation in luminance in the implementation of FIG. 16B because it allows some or all of the electrodes to be driven. Moreover, for the multi-phosphor design of FIG. 17B, both chrominance and luminance may be varied since the electrodes may be selected to emphasize or de-emphasize any color. The arrangement of FIGS. 16C and 17C offer intermediate flexibility, with half of the electrodes 155 or 355 connected to one conductor and the other half connected to a second conductor. This allows the light to be dimmed by approximately half.

The designs of FIG. 16D–16E and 17D also show the flexibility which may be achieved with the solid state light source of the present invention. In addition, the electrode arrangement shown may be modified in accordance with FIGS. 16A–C or 17A–C, respectively.

Referring next to FIGS. 18–20, various implementations of the light source of the present invention may be appreciated. For example, as shown in FIG. 18, the light panel of the present invention may be used as a backlight 505 for a flat panel display 510, such as might be used in a computer or instrument 515. In addition, as shown in FIG. 19, the LED structure 530 of the present invention may be used to form alphanumeric characters 535 or other formulations for use either as signs or displays. Further, as shown in FIG. 20, multiple units 550 of the present invention may be combined to form a large, ambient light source 565, with at least some embodiments capable of being adjusted either as to color or brightness.

Having fully described a preferred embodiment of the invention and various alternatives, those skilled in the art will recognize, given the teachings herein, that numerous alternatives and equivalents exist which do not depart from the invention. It is therefore intended that the invention not be limited by the foregoing description, but only by the appended claims.

What is claimed is:

1. A light emitting diode comprising
   a substrate,
   a first cladding layer of a first conductivity type disposed above a portion of the substrate, the cladding layer having an upper surface,
   an active layer having a thickness disposed over at least a portion of the upper surface of the first cladding layer, said thickness being less than 1 μm;
   a second cladding layer of a second conductivity type disposed over the active layer, the first cladding layer, the active layer and the second cladding layer forming a ridge with a portion of the active layer exposed at a side of the ridge,
   a first electrode disposed to connect electrically to the first cladding layer, and
   a second electrode disposed to connect electrically to the second cladding layer.

2. A semiconductor structure comprising:
   a substrate;
   a first conductive layer of a first conductivity type disposed above at least a portion of the substrate;
   an active layer disposed over at least a portion of the first conductive layer, said active layer having a thickness of less than 1 μm;
   a second conductive layer of a second conductivity type disposed over at least a portion of the active layer, wherein the first conductive layer, the active layer and the second conductive layer together form a ridge with respect to the substrate and wherein a portion of the active layer is exposed at a side of the ridge;
   a first electrode disposed to connect electrically to the first conductive layer; and
   a second electrode disposed to connect electrically to the second conductive layer.

3. The semiconductor device as recited in claim 2, wherein the second electrode is disposed on and substantially covering the second conductive layer.

4. A semiconductor structure comprising:
   a conductive substrate;
   a first conductive layer of a first conductivity type disposed above at least a portion of the substrate;
   an active layer disposed over at least a portion of the first conductive layer, said active layer having a thickness of less than 1 μm;
   a second conductive layer of a second conductivity type disposed over at least a portion of the active layer, wherein the first conductive layer, the active layer and the second conductive layer together form a ridge with respect to the conductive substrate and wherein a portion of the active layer is exposed at a side of the ridge;
   a first electrode disposed to connect electrically to the first conductive substrate; and
   a second electrode disposed to connect electrically to the second conductive layer.

5. A light-emitting semiconductor structure comprising
   a substrate;
   a first conductive layer of a first conductivity type disposed above at least a portion of the substrate;
   an active layer disposed over at least a portion of the first conductive layer, said active layer having a thickness of less than 1 μm;
   a second conductive layer of a second conductivity type disposed over at least a portion of the active layer, wherein the first conductive layer, the active layer and the second conductive layer together form first and second non-intersecting ridges with respect to the substrate and wherein a portion of the active layer is exposed at adjacent sides of the first and second non-intersecting ridges;

a first electrode disposed to connect electrically to the first conductive layer;

and a second electrode disposed to connect electrically to the second conductive layer.

6. The light-emitting semiconductor structure as recited in claim 5, further comprising a phosphor material disposed between the first and second non-intersecting ridges.

7. A light-emitting semiconductor structure comprising a substrate;

a first conductive layer of a first conductivity type disposed above at least a portion of the substrate;

an active layer disposed over at least a portion of the first conductive layer, said active layer having a thickness of less than 1 μm;

a second conductive layer of a second conductivity type disposed over at least a portion of the active layer, wherein the first conductive layer, the active layer and the second conductive layer together form first and second non-intersecting ridges with respect to the substrate, wherein a portion of the active layer is exposed at adjacent sides of the first and second non-intersecting ridges and wherein a first portion of the second conductive layer forming the first non-intersecting ridge is electrically insulated from a second portion of the second conductive layer forming the second non-intersecting ridge;

a first electrode disposed to connect electrically to the first conductive layer;

a second electrode disposed to connect electrically to the first portion of the second conductive layer; and a third electrode disposed to connect electrically to the second portion of the second conductive layer.

8. A light-emitting semiconductor structure comprising a substrate;

a first ridge-shaped light-emitting diode (LED) structure formed on the substrate, the first ridge-shaped LED structure comprising a first portion of a first conductive layer of a first conductivity type, a first portion of an active layer disposed over at least a portion of the first portion of the first conductive layer, and a first portion of a second conductive layer of a second conductivity type disposed over at least a portion of the first portion of the active layer, wherein a first sub-portion of the first portion of the active layer is exposed;

a second ridge-shaped LED structure formed on the substrate, the second ridge-shaped LED structure comprising a second portion of the first conductive layer, a second portion of the active layer disposed over at least a portion of the second portion of the second portion of the first conductive layer, and a second portion of a second conductive layer of a second conductivity type disposed over at least a portion of the second portion of the active layer, wherein a first sub-portion of the second portion of the active layer adjacent to the first ridge-shaped LED structure is exposed; and a phosphor material disposed between the first and second ridge-shaped LED structures and in contact with the first sub-portions of the first and second portions of the active layer.

9. The light-emitting semiconductor structure as recited in claim 8, wherein the first and second portions of the second conductive layer are electrically connected, and the light-emitting semiconductor structure further comprises a first electrode disposed to connect electrically to the first and second portions of the first conductive layer, and a second electrode disposed to connect electrically to the first and second portions of the second conductive layer.

10. The light-emitting semiconductor structure as recited in claim 8, wherein:

the first and second portions of the second conductive layer are electrically connected, the substrate is electrically conductive, and the light-emitting semiconductor structure further comprises a first electrode disposed to connect electrically to the electrically conductive substrate, and a second electrode disposed to connect electrically to the first and second portions of the second conductive layer.

* * * * *